United States Patent
Ang et al.

(10) Patent No.: US 8,037,444 B1
(45) Date of Patent: Oct. 11, 2011

(54) PROGRAMMABLE CONTROL OF MASK-PROGRAMMABLE INTEGRATED CIRCUIT DEVICES

(75) Inventors: Boon Jin Ang, Penang (MY); Bee Yee Ng, Penang (MY); Thow Pang Chong, Penang (MY); Yu Fong Tan, Penang (MY)

(73) Assignee: Altera Corporation, San Jose, CA (US)

( * ) Notice: Subject to any disclaimer, the term of this patent is extended or adjusted under 35 U.S.C. 154(b) by 915 days.

(21) Appl. No.: 11/490,750

(22) Filed: Jul. 20, 2006

(51) Int. Cl.
G06F 9/455 (2006.01)
G06F 17/50 (2006.01)

(52) U.S. Cl. ........ 716/134; 716/116; 716/121; 716/128; 716/132; 326/37; 327/525; 365/96; 365/225.7

(58) Field of Classification Search .............. 716/16–17, 716/116, 121, 128, 132, 134; 365/189.011, 365/96, 225.7; 326/37; 327/525
See application file for complete search history.

(56) References Cited

U.S. PATENT DOCUMENTS

| | | | |
|---|---|---|---|
| 5,349,544 A * | 9/1994 | Wright et al. ................. 708/1 |
| 7,825,708 B2 * | 11/2010 | Thomsen et al. ............ 327/156 |
| 2004/0008805 A1 * | 1/2004 | Xiu et al. .................... 375/376 |
| 2004/0111231 A1 * | 6/2004 | Ando ........................... 702/117 |
| 2005/0001600 A1 * | 1/2005 | Morales ....................... 323/282 |
| 2005/0018517 A1 * | 1/2005 | Collura et al. ............. 365/225.7 |
| 2005/0258861 A1 * | 11/2005 | Kurts et al. .................... 326/38 |
| 2006/0001444 A1 | 1/2006 | Chua et al. |
| 2006/0033532 A1 | 2/2006 | Watt |
| 2006/0277430 A1 * | 12/2006 | Shubat et al. ................. 714/5 |
| 2007/0247960 A1 * | 10/2007 | Minzoni et al. .............. 365/233 |

* cited by examiner

*Primary Examiner* — Paul Dinh
*Assistant Examiner* — Nha Nguyen
(74) *Attorney, Agent, or Firm* — Ropes & Gray LLP

(57) ABSTRACT

An integrated circuit device such as a structured ASIC includes a mask-programmable portion and a post-fabrication-programmable portion. The mask-programmable portion includes circuitry that is able to read information from the post-fabrication-programmable portion and use that information to affect operation of other componentry of the mask-programmable portion. Signal timing is an example of the kind of operation that may be affected by the above-mentioned information, which may allow post-fabrication timing tuning of the device.

18 Claims, 3 Drawing Sheets

PROGRAMMABLE CONTROL OF MASK-PROGRAMMABLE INTEGRATED CIRCUIT DEVICES

BACKGROUND OF THE INVENTION

This invention relates to mask-programmable integrated circuit devices, and more particularly to making it possible to modify the performance of such devices after fabrication in a way that is programmable but that does not require mask modification.

An example of a mask-programmable device is a so-called structured ASIC (application-specific integrated circuit). See, for example, Chua et al. U.S. published patent application 2006/0001444A1. Such devices may be used to provide lower-cost alternatives to programmable logic devices (PLDs) or field-programmable gate arrays (FPGAs) that have been programmed in a particular way. (FPGA is used herein as a generic term, which also includes PLDs.) For example, after a user's logic design has been proven in a programmed FPGA implementation of that design, the design may be "migrated" to a structured ASIC implementation of the design. The structured ASIC may have certain masks that are the same or substantially the same for all structured ASIC products of that general kind. Only certain other masks need to be "customized" to implement a particular user's logic design in the structured ASIC. For example, these customizable masks may determine what logic function options are performed by basic logic units in the device, and also what logic unit interconnection options are employed.

Although highly developed techniques may be employed to minimize operational differences between the user's logic design as implemented in a programmed FPGA and as implemented in a structured ASIC, some such differences may occur. These differences may be small or subtle (e.g., in the relative timing of various signals on the two types of devices), but they may have a deleterious impact on the performance of the structured ASIC relative to the programmed FPGA. Once the structured ASIC has been fabricated, however, adjusting its performance may be impossible without changing one or more masks and fabricating the product anew.

SUMMARY OF THE INVENTION

In accordance with this invention, elements that are programmable after fabrication of an integrated circuit (i.e., so-called post-fabrication-programmable elements) are provided on an otherwise mask-programmable integrated circuit. If the integrated circuit is found to be not giving the performance needed or expected, these post-fabrication-programmable elements can be programmed to cause performance of the integrated circuit to be modified in various respects. The post-fabrication-programmable elements are preferably non-volatile so that each time the integrated circuit is started, the information contained in them can be transferred to one or more operational components of the device. In such an operational component the information received from the post-fabrication-programmable elements affects the performance or operation of that component in at least some respect. In this way the overall performance of the integrated circuit can be brought closer to what is desired without having to resort to mask changes and re-fabrication of the product.

Further features of the invention, its nature and various advantages, will be more apparent from the accompanying drawings and the following detailed description.

DETAILED DESCRIPTION

Figure 1:
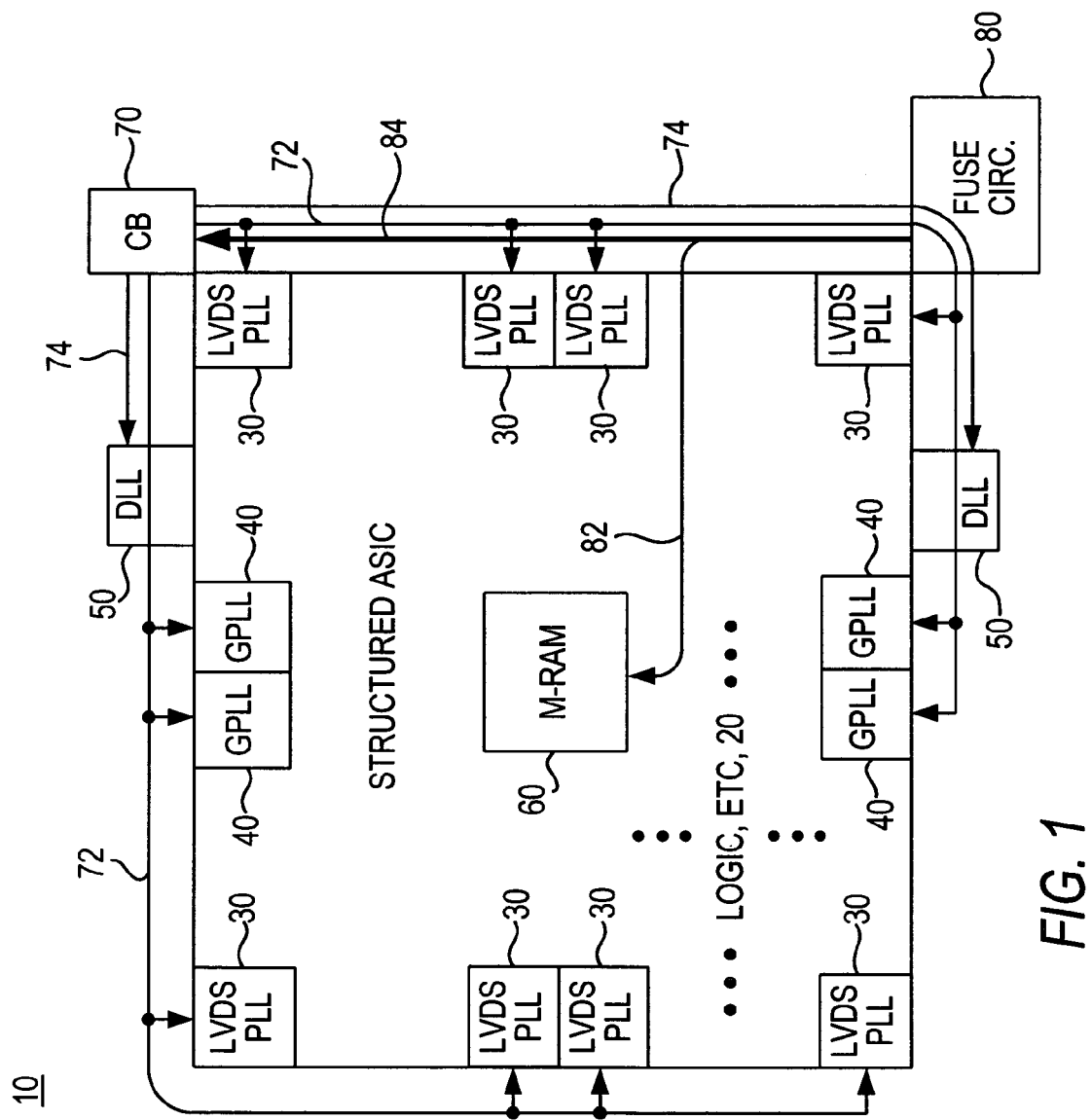
FIG. 1 is a simplified block diagram of an integrated circuit including an illustrative embodiment of circuitry in accordance with the invention.

FIG. 1 illustrates application of the principles of the invention to a structured ASIC 10. It will be understood that the invention is also applicable to other types of integrated circuits such as ASICs generally and even to FPGAs. Nevertheless, the invention is particularly useful and advantageous as applied to structured ASICs.

Structured ASIC 10 includes logic and similar circuitry 20, LVDS PLL (low-voltage differential signaling phase-locked loop) circuitry 30, GPLL (general-purpose PLL) circuitry 40, DLL (delay line) circuitry 50, M-RAM (mega random access memory) circuitry 60, programmable fuse circuitry 80, and CB (control block) circuitry 70. FIG. 1 illustrates application of the invention to the post-fabrication-programmable control of timing circuit elements such as LVDS PLLs 30, GPLLs 40, and DLLs 50. It will be understood that the same techniques can alternatively or additionally be applied to post-fabrication-programmable control of other aspects of device 10 such as control of certain logic function options, certain logic block interconnection options, and/or the like.

M-RAM 60 allows output signals of the post-fabrication-programmable circuitry to be used for redundancy purposes. The M-RAM redundancy replaces a defective memory column in the array (core of device 10) with a redundant column.

Fuse circuitry 80 is non-volatile memory circuitry that can be programmed after device 10 has been fabricated (i.e., so-called "post-silicon"). Circuitry 80 is therefore referred to as post-fabrication-programmable memory. Although FIG. 1 shows circuitry 80 as fuses, any other non-volatile memory technology can be used instead if desired. For example, circuitry 80 may be programmable fuses (e.g., polyfuses or metal fuses), EEPROM (electrically erasable programmable read-only memory), OTP (one-time programmable) elements, antifuses, etc.

In accordance with the present invention, some of circuitry 80 may be used for storing data that can be used to modify the performance of various operational circuit elements elsewhere on device 10. The following discussion assumes that this is being done in order to modify the performance of some or all of circuit elements 30/40/50. Certain operations of programmable fuse circuitry 80 (and other circuitry) are controlled by CB 70 as will now be described.

Prior to entering user mode, CB 70 shifts the fuse values from programmable fuse block 80 into M-RAM block(s) 60 via leads 82. (Fuse block 80 does not have to be associated with M-RAM 60. Fuse block 80 could alternatively or additionally have any other use on device 10.) During this data shifting, CB 70 listens to the data and samples fuse values that relate to IO (input/output) subsystems like 30/40/50 into data storage registers (e.g., flip-flops) that can be part of CB 70. This listening and data sampling is performed via branch leads 84. CB 70 then broadcasts the fuse values that are now stored in CB registers to the appropriate 10 subsystem blocks such as PLLs 30/40 and/or DLLs 50. This broadcast to PLLs 30/40 is performed via leads 72. The broadcast to DLLs 50 is performed via leads 74. PLLs 30/40 and DLLs 50 use the broadcast fuse values to modify various aspects of their operation. For example, DLLs 50 may add or subtract a control value supplied via leads 74 to or from a locked value (provided during fabrication) to generate a new phase control value. Similarly, PLLs 30/40 may select a different VCO (voltage-controlled oscillator) phase shift on the feedback path to phase shift the global/local clock (GPLLs 40) or the fast clock (LVDS PLLs 30). More details regarding illustrative PLL and DLL implementation of what is referred to above will be provided next.

PLLs and DLLs are widely used in various 10 system designs to phase shift the clock and data signals in order to meet system timing and specifications. Therefore, implementing post-fabrication-programmable control (e.g., via fuses 80) in these blocks allows greater control in the post-silicon system timing tuning. The material below describes illustrative programmable fuse implementations in structured ASIC PLL and DLL blocks like those variously shown at 30, 40, and 50 in FIG. 1.

Figure 2:
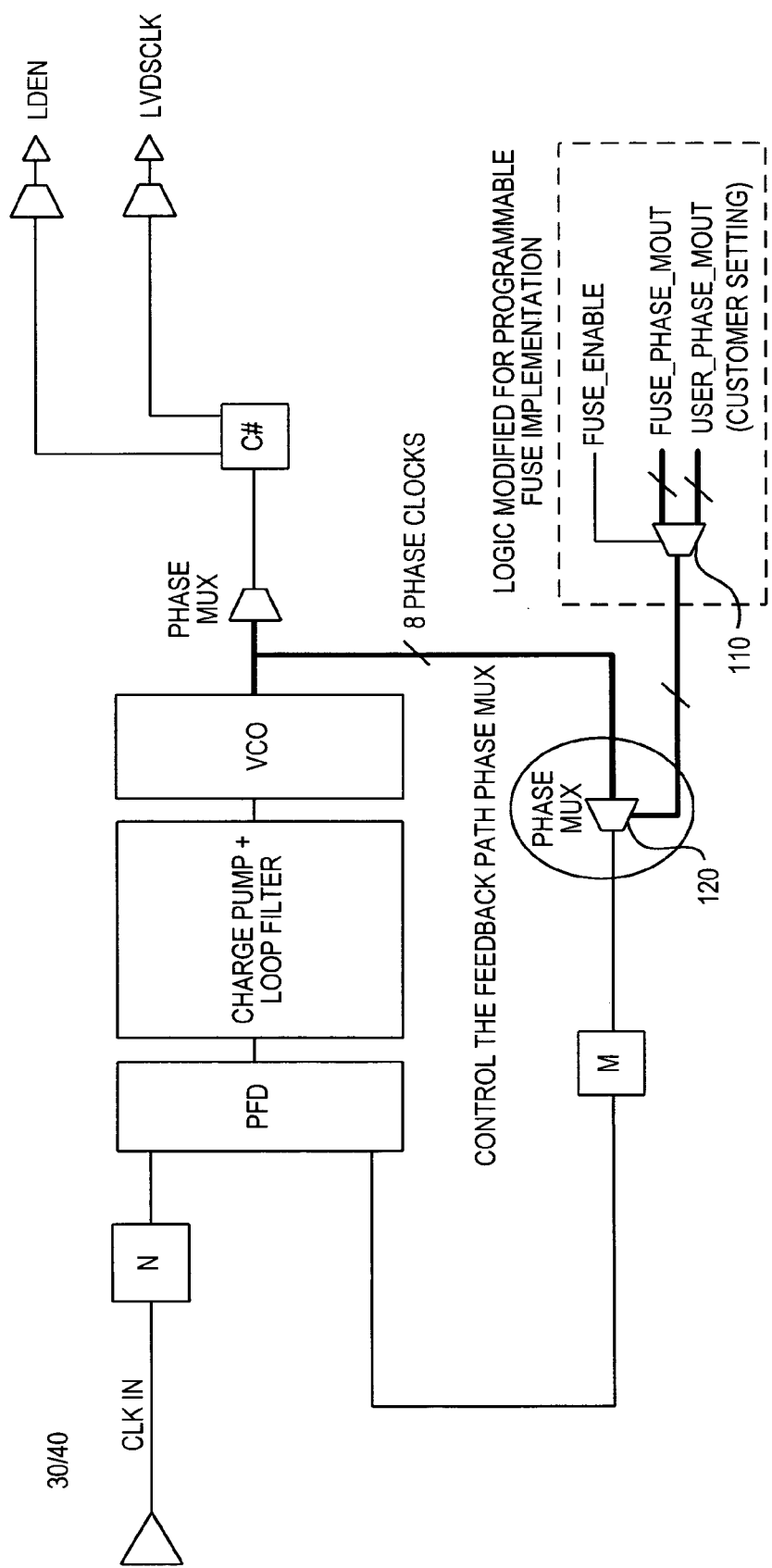
FIG. 2 is a more detailed, but still simplified block diagram of an illustrative embodiment of a representative portion of FIG. 1 in accordance with the invention.

Illustrative PLL circuitry 30/40 that has been modified in accordance with an illustrative embodiment of the present invention is shown in FIG. 2. Most of what is shown in FIG. 2 is conventional and will not need to be described in detail because it will be understood by those skilled in the art from the FIG. alone. The various labels used in FIG. 2 have the following meanings:

| | |
|---|---|
| N = | a frequency division factor |
| PFD = | phase and frequency detector |
| VCO = | voltage-controlled oscillator |
| C# = | C counter |
| LDEN = | load enable signal |
| LVDSCLK = | low-voltage differential signaling clock |
| M = | a frequency division factor |

The circuitry in FIG. 2 that is altered in accordance with the present invention is in the area of mux (multiplexer 110). All the GPLL/FPLL modes go through the same feedback path mux 120. The feedback path phase mux 120 setting is controlled by the output signals of mux 110. The ultimate source of the Fuse_Enable and Fuse_Phase_Mout signals is programmable fuse circuitry 80 in FIG. 1. These signals are therefore post-fabrication-programmable. The User_Phase_Mout signals, on the other hand, come from mask-programmable switches, so that the values of these signals are fixed when device 10 is fabricated. One of the eight VCO phase outputs is selected for feedback by mux 120. During any desired post-silicon timing fix, when Fuse_Enable is asserted, Fuse_Phase_Mout will be set according to the required (and post-fabrication-programmable) clock phase shift adjustment.

Figure 3:
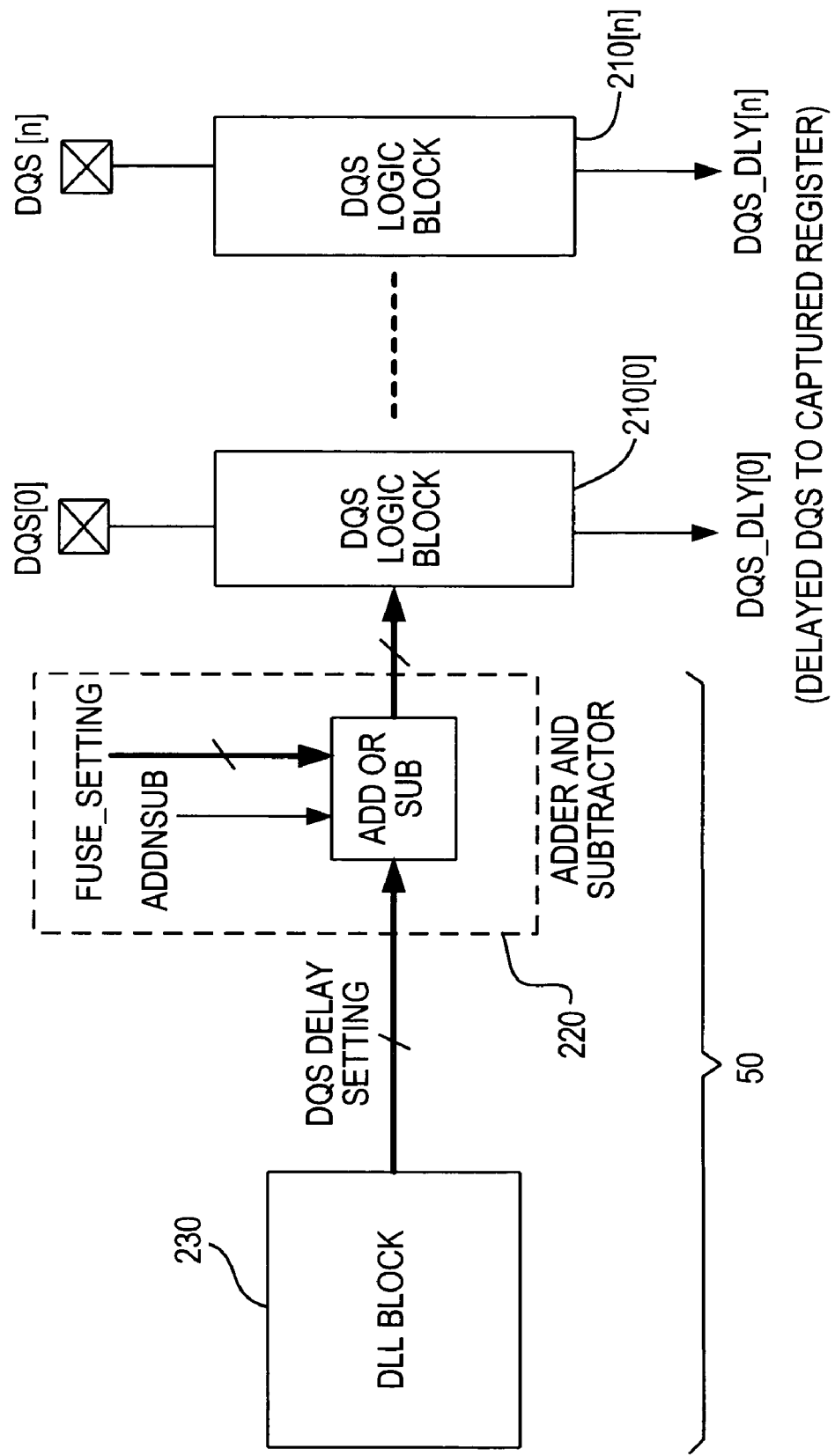
FIG. 3 is a more detailed, but still simplified block diagram of an illustrative embodiment of another representative portion of FIG. 1 in accordance with the invention.

Turning now to the illustrative DLL 50 embodiment shown in FIG. 3, in devices of the type shown in FIG. 1 the DLL block is used to generate a set of DQS (data strobe signal for DDR (double data rate) interface(s)) delay settings to control DQS logic blocks 210. Each DQS logic block 210 has a delay element implemented to delay the incoming DQS strobe based on the DQS delay setting. In accordance with this invention, an adder and subtractor 220 can be implemented after the DQS delay setting conventionally provided by conventional DLL block 230. Adder and subtractor 220 is controlled by the post-fabrication-programmable fuse data/control signals AddNSub and Fuse_Setting. The ultimate source of these signals can be programmable fuse circuitry 80 in FIG. 1. The Fuse_Setting value is then added to or subtracted from the DLL-generated DQS delay setting to produce a new adjusted setting to increase or reduce the delay of the DQS logic block(s) 210. This is very useful for a high-performance DDR IO system implementation which has a tight read margin due to such things as uncertainties about the properties of an associated printed circuit board. Similar to the LVDS case 30, DDR systems also require accurate DQS delay setting(s) in order to obtain center-alignment between the data strobe and the data eye.

The following discussion is provided to further explain various motivations for and benefits of the invention. Again, this discussion refers specifically to structured ASICs as alternatives to implementing a user's logic design in a programmed FPGA, but the invention is also applicable to other devices such as FPGAs and ASICs generally. Also, although the following discussion focuses on post-silicon timing improvement, the invention is also applicable to post-silicon logic/functionality correction.

A typical FPGA is CRAM (configuration random access memory) programmable. For certain system implementations, users need to set the delay elements or phase shift elements accurately in order to meet system timing and specifications. For example, in the LVDS input interface design, the engineering delay chains in the PLL are set to make the LVDSCLK center-aligned to the LVDSDATA signal. In the DDR read system interface design, delay elements are set in order to center-align the DQS data strobe to the DQ data eye. By using FPGA devices, the system timing improvement can be easily done post-silicon. Users can re-program the FPGA devices to change the delay element settings until the best system timing closure is obtained.

In structured ASIC devices that are intended to be functionally equivalent to a programmed FPGA, to save die area and cost, all the programmable CRAMs are replaced with mask-programmable metal switches. As a result, any post-silicon fix in a structured ASIC requires mask re-spin, which is costly and affects the device delivery time to customers.

Due to some architecture differences between FPGAs and structured ASICs, users may not be able to use the same delay element settings for the same system design implementation in both devices. In addition, there can also be timing issues originated from customers themselves due to the following factors: (1) board design is not optimum, and (2) timing constraints are not correctly specified. Therefore, any inaccuracies in the pre-silicon delay element settings may require a mask re-spin for a post-silicon fix. This option is costly and inflexible for users to perform any post-silicon timing tuning.

The programmable switches solution (elements 80, 70, etc. in FIG. 1) can overcome the issues described above. When any timing issues show up after fabrication of the mask-programmable prototype, the cause of the problem can be identified and a "fix" determined. Then, the test program and manufacturing flow can be set up to "blow" the switches (e.g., fuses) appropriately to change the delay element settings during the post-silicon timing fix. No mask re-spin is required.

The programmable switches 80 act as "one-time programmable switches" that control various block settings elsewhere on the device. Programmable switches can be implemented in various blocks, such as PLL, DLL memory blocks, logic blocks, and IO decoder/register blocks for post-silicon IO system timing and register-to-register timing tuning. Designers can decide the trade-off between die area and cost versus the need to allow maximum control in terms of functionality and timing risks.

For example, for a 1.25 GHz (gigahertz) LVDS RX (receiver) interface, the UI (unit interval) is only 800 ps (picoseconds). Thus, the sampling window, RSKM (receiver input skew margin), and TCCS (channel-to-channel skew) timing margins are very tight. Any timing constraints inaccuracy of board design uncertainties may easily cause the timing to be marginally passing/failing the specifications. As an example, the RSKM and TCCS specification may be 60% of UI, which is 480 ps. Therefore, the sampling window has only 320 ps. Because of the tight specifications, even a 100 ps difference in terms of clock phase can be sensitive enough to cause the system timing to fail the specifications. However, by implementing the programmable switch in a PLL block, the LVDSCLK phase can be easily adjusted to obtain center-alignment between the LVDSCLK and LVDSDATA signals.

It is preferable for the default mode to be such that where programmable switches (e.g., fuses 80) are not programmed/blown, there is no interference with user mode functionality.

FIG. 1 shows an example of implementing IO system poly fuses 80 in a structured ASIC device such as the HardCopy-II product available from Altera Corporation of San Jose, Calif. In this example, the unused poly fuses 80 are utilized for purposes of this invention in the manner described earlier in this specification.

The following recapitulates some of the advantages of the invention. The invention saves cost (no mask re-spin) and provides faster turn-around time for post-silicon fix of mask-programmable integrated circuits such as structured ASICs. The invention provides faster time-to-market for users, thus generating more revenue for users and the supplier of the integrated circuit. The invention reduces IO system design risks in products like structured ASICs. The invention provides flexibility in post-silicon timing tuning. The invention allows post-silicon phase/delay adjustment to improve system timing and the like due to possible inaccuracy of simulation models, PLL delay compensation, and timing model and incorrect user assumptions (e.g., printed circuit board delays).

It will be understood that the foregoing is only illustrative of the principles of the invention, and that various modifications can be made by those skilled in the art without departing from the scope and spirit of the invention. For example, the numbers and locations of components such as 30, 40, and 50 can be different from the illustrative embodiment shown in FIG. 1.

The invention claimed is:

1. An integrated circuit device comprising:
    mask-programmable circuitry that includes a first portion operable to store fixed data;
    post-fabrication-programmable circuitry; and
    multiplexer circuitry having a first selectable input coupled to receive a first output signal of the post-fabrication-programmable circuitry, a second selectable input coupled to receive an output signal of the first portion of the mask-programmable circuitry including the fixed data, a selection control input coupled to receive a second output signal of the post-fabrication-programmable circuitry, and an output providing a multiplexer output signal that is coupled to affect operation of a second portion of the mask-programmable circuitry, the multiplexer circuitry being controllable by the signal received via the selection control input to select which of the first and second selectable inputs the multiplexer circuitry couples to the output; wherein:
    the post-fabrication-programmable circuitry comprises memory circuitry, one-time programmable circuitry, or fuse circuitry; and
    the multiplexer circuitry allows an output signal of the post-fabrication-programmable circuitry to affect timing of a signal in the mask-programmable circuitry.

2. The device defined in claim 1 wherein the post-fabrication-programmable circuitry comprises non-volatile memory circuitry.

3. The device defined in claim 1 wherein the post-fabrication-programmable circuitry comprises one-time-programmable circuitry.

4. The device defined in claim 1 wherein the post-fabrication-programmable circuitry comprises fuse circuitry.

5. The device defined in claim 1 wherein the mask-programmable circuitry includes PLL circuitry, and wherein the multiplexer circuitry allows output signals of the post-fabrication-programmable circuitry to be used to affect phase of a feedback signal in the PLL circuitry.

6. The device defined in claim 1 wherein the mask-programmable circuitry includes DLL circuitry, and wherein the multiplexer circuitry allows output signals of the post-fabrication-programmable circuitry to be used to affect a delay setting output by the DLL circuitry.

7. The device defined in claim 1 wherein the mask-programmable circuitry comprises structured ASIC circuitry.

8. A method of operating an integrated circuit device that includes mask-programmable circuitry and post-fabrication-programmable circuitry, the method comprising:
    reading information from the post-fabrication-programmable circuitry that was programmed into the post-fabrication-programmable circuitry after fabrication of the device; and
    using signal conductor circuitry on the integrated circuit to transfer the information that is read from the post-fabrication-programmable circuitry during the reading to registers in the mask-programmable circuitry wherein the signal conductor circuitry extends on the integrated circuit from the post-fabrication-programmable circuitry to the registers in the mask-programmable circuitry, and wherein the information that is read from the post-fabrication-programmable circuitry and transferred to the registers via the signal conductor circuitry includes a signal that determines whether or not other parts of said information will be used to contribute to control of at least one other portion of the mask-programmable circuitry; wherein:
    the registers contribute to controlling a timing aspect of operation of the at least one other portion of the mask-programmable circuitry; and
    the post-fabrication-programmable circuitry comprises memory circuitry, one-time programmable circuitry, or fuse circuitry.

9. The method defined in claim 8 wherein the reading and using are performed during an initialization phase of operation of the device, wherein the initialization phase precedes a normal user-mode operation phase of the device.

10. The method defined in claim 9 wherein the registers can contribute to control of the normal user-mode operation of the at least one other portion of the mask-programmable circuitry.

11. The method defined in claim 8 wherein the timing aspect affects phase of a feedback signal in PLL circuitry.

12. The method defined in claim 8 wherein the timing aspect affects a delay setting output by DLL circuitry.

13. A structured ASIC comprising:
    a mask-programmable portion that includes a portion operable to store fixed data; and
    a post-fabrication-programmable portion;

the mask-programmable portion including circuitry to read information from the post-fabrication-programmable portion and use that information instead of the fixed data to affect operation of other components of the mask-programmable portion, wherein said information read from said post-fabrication-programmable portion includes a signal that determines whether or not other parts of said information read from said post-fabrication-programmable portion will be used to affect operation of said other components, and wherein said circuitry responsive to a logical state of said signal uses said other parts of said information to affect operation of said other components;

wherein:

the circuitry comprises registers for storing the information read from the post-fabrication-programmable portion;

the registers contribute to controlling a timing aspect of the operation of said other components of said mask-programmable circuitry; and the post-fabrication-programmable portion comprises memory circuitry, one-time programmable circuitry, or fuse circuitry.

14. The structured ASIC defined in claim 13 wherein the post-fabrication-programmable portion comprises non-volatile memory circuitry.

15. The structured ASIC defined in claim 13 wherein the mask-programmable portion comprises PLL circuitry, and wherein the information can be used to affect operation of the PLL circuitry.

16. The structured ASIC defined in claim 15 wherein the information can be used to affect phase of a signal used in the PLL circuitry.

17. The structured ASIC defined in claim 13 wherein the mask-programmable portion comprises DLL circuitry, and wherein the information can be used to affect operation of the DLL circuitry.

18. The structured ASIC defined in claim 17 wherein the information can be used to affect value of a signal produced by the DLL circuitry.

* * * * *